Sept. 30, 1958 M. F. H. GOUVERNEUR II 2,854,552

SWITCH MEANS FOR PRINTED CIRCUITS

Filed Dec. 27, 1955

INVENTOR.

Minor F. H. Gouverneur II.

By: Olson & Trexler

Attys.

United States Patent Office 2,854,552

Patented Sept. 30, 1958

2,854,552

SWITCH MEANS FOR PRINTED CIRCUITS

Minor F. H. Gouverneur II, Wheaton, Ill., assignor to Illinois Tool Works, Chicago, Ill., a corporation of Illinois Application December 27, 1955, Serial No. 555,359

7 Claims. (Cl. 200—158)

The present invention relates to a novel electrical circuit structure such as a printed circuit structure, and more particularly to a novel switch adapted to be incorporated in such a circuit structure.

Many chassis presently being manufactured for television and other electrionic equipment utilize printed circuits which, as will be understood, includes a base or panel of insulating material having circuit elements of copper or other suitable conductive material printed thereon. In certain instances it is desirable to modify the basic circuit of a given chassis in accordance with the requirements of a particular locality in which the chassis is to be used. For example, it is often desired to modify the circuit of a television set so as to eliminate the channels for which there is no television station in a given area. Such a modification of a circuit is particularly desirable when an automatic or remote tuning device is to be used in connection with the television set. However, for purposes of manufacturing economy it is desirable to construct all chassis for a given model television set identically. Therefore, it is an object of the present invention to provide a novel circuit structure including simple, economical and easily adjustable switch means whereby the circuit may be readily modified when the locality and/or the particular requirements of its use are determined.

A more specific object of the present invention is to provide a simple and economical switch structure which may be easily applied to an aperture workpiece such as a printed circuit panel and which may be easily adjusted for connecting or disconnecting a plurality of terminal or circuit elements.

Another object of the present invention is to provide a novel switch structure of the above described type which is formed to provide an indication as to whether or not it is adjusted to open or close a circuit even though a contact portion thereof is located to be inaccessible or hidden.

Still another object of the present invention is to provide a novel and simple switch structure of the above described type which is adjustable for connecting and disconnecting a plurality of sets of terminals or circuit elements.

Still another more specific object of the present invention is to provide a novel switch structure of the above described type which may be mounted so that a contact portion thereof is disposed behind or at the blind side of a panel or the like and which has a portion extending to an accessible position to facilitate adjustment of the contact portion.

Other objects and advantages of the present invention will become apparent from the following description and the accompanying drawings, wherein.

Figures 1, 2, 3, 4, 5, 6, 7, 8:
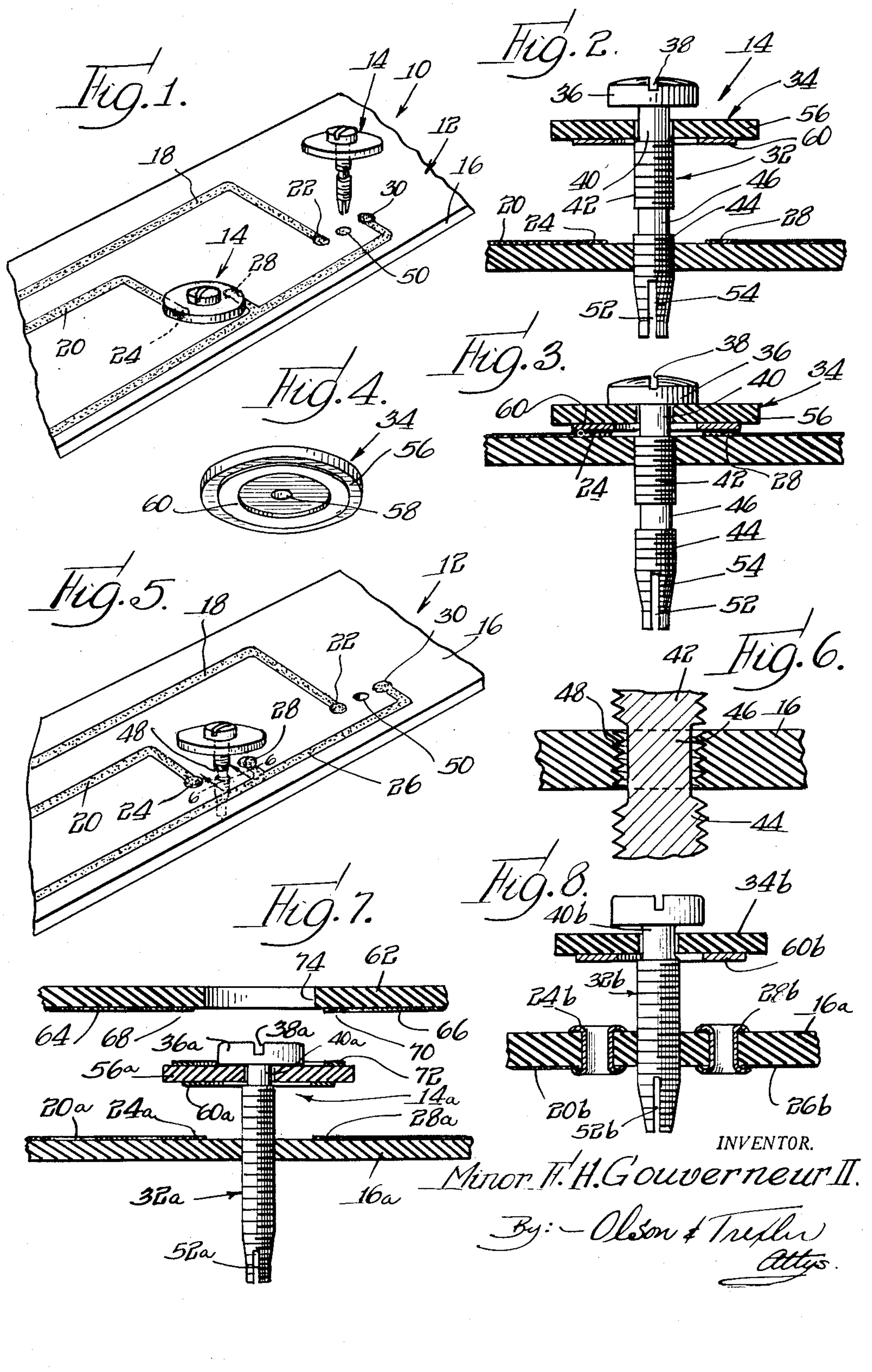
Fig. 1 is a fragmentary perspective view showing a portion of a chassis included a printed circuit structure and a switch structure incorporating the principles of the present invention.
Fig. 2 is an enlarged fragmentary partial sectional view showing a novel switch structure of the present invention in a partially assembled condition.
Fig. 3 is a view similar to Fig. 2 but shows the switch structure fully assembled and closed.
Fig. 4 is a perspective view showing the contact assembly of a novel switch structure of this invention.
Fig. 5 is a fragmentary perspective view similar to Fig. 1 but showing a switch structure adjusted to an open position.
Fig. 6 is an enlarged fragmentary sectional view taken along line 6—6 in Fig. 5.

Fig. 7 is a fragmentary partial sectional view showing a modified form of the present invention wherein the switch structure is adapted selectively to connect and/or to disconnect a pair of sets of terminals or circuit elements on a pair of base members or panels; and Fig. 8 is a fragmentary partial sectional view showing another modified form of the present invention wherein the contact portion or assembly of the switch structure is disposed at a side of the base or panel opposite from the circuit elements on the panel.

Referring now more specifically to the drawings wherein like parts are designated by the same numerals throughout the various figures, a circuit structure 10 incorporating the features of the present invention is shown in Figs. 1–6 and includes printed circuit means 12 and one or more switch structures 14. As will be understood, the printed circuit means 12 includes a base or panel 16 formed from a suitable electrical insulating material, and a plurality of circuit elements of copper or the like deposited, printed or attached on the panel. In the embodiments shown the circuit means includes circuit elements 18 and 20 respectively having terminals 22 and 24, and a circuit element 26 having a pair of terminals 28 and 30. It is, of course, understood that the arrangement of the circuit elements may be varied in accordance with the requirements of any particular chassis. The portion of the chassis shown also includes two switch structures 14 respectively adapted to connect or disconnect the terminals 24—28 and the terminals 22—30.

Each switch structure 14 includes a screw member 32 and a contact assembly 34. The screw member is provided with a head 36 having a slot 38 therein for accommodating a screwdriver or the like, and an axially extending shank. In this embodiment the shank is provided with a smooth or reduced diameter portion 40 adjacent the head, and portions 42 and 44 having helical thread convolutions formed thereon. In addition, a smooth or reduced diameter portion 46 is provided between the threaded portions for the purpose described below.

The screw member shank is adapted to be axially adjustably mounted on the panel or base 16, and more particularly the panel is provided with an aperture for receiving the screw. In the embodiment shown apertures 48 and 50 are provided adjacent and preferably between the sets of terminals 24—28 and 22—30. The apertures may be provided with internal threads for accommodating the screw members of their associated switch structures, but preferably the apertures are formed with smooth walls and the screw member of each switch structure is provided with means for forming or cutting threads as it is turned through an aperture. More specifically, the entering end of the shank portion 44 of the screw member is tapered as shown best in Figs. 2 and 3 to facilitate starting thereof into an aperture, and a slot 52 is formed slightly off center in the centering end portion so as to intersect the thread convolutions thereon and provide a thread cutting edge 54.

The contact assembly 34 comprises an annular member 56 formed from any suitable electrical insulating material. The annular member is disposed on the reduced diameter portion 40 of the screw shank adjacent the head 36, and the internal diameter of the central opening 58 in the annular member is less than the external diameter of the thread convolutions of the shank portion 42 so that the thread convolutions retain the screw member and the contact assembly in permanent preassembled relationship and prevent the annular member 56 from shifting a substantial amount axially along the shank. A circuit element 60 of electricity conductive material is disposed on one face of the annular member so as to be spaced from and insulated from the screw member. The circuit element may be printed on the annular member 56 and is preferably annular so as to insure engagement with the terminals on the printed circuit panel.

During construction of a chassis, each switch structure 14 is initially applied to the aperture base or panel as shown in Fig. 2. Then each switch structure may be tightened or axially adjusted to the fully closed position as shown best in Fig. 3 with the circuit element 60 engaging a pair of terminals on the circuit panel, or, if desired, one or more of the switch structures may be left in opened position. When it is desired to modify the circuit it is merely necessary for a serviceman to turn and adjust one or more of the switch structures to the desired open or closed positions. Assuming that it is desired to open a given switch structure which is closed, the serviceman turns the screw member of this switch structure reversely until the intermediate reduced diameter portion 46 is disposed in the panel aperture as shown in Figs. 5 and 6. This reduced diameter portion, which is longer than the thickness of the panel floats freely in the aperture and thereby provides an indication to the serviceman that the switch structure has been adjusted to an opened position. The serviceman then terminates the adjustment of the screw member so that it will not be completely removed from the panel and possibly be dropped into another portion of a chassis and cause a short circuit or become lost. It should be noted that in the event the printed circuit panel with the switch structures mounted thereon is assembled in a chassis or in a cabinet in a manner which prevents easy access to the head of the screw members, the screw members may still be easily adjusted by utilizing the slots 52 in the projecting ends of the shanks for accommodating a screw driven or the like.

Fig. 7 shows a modified form of the present invention which is similar to the above described structure as indicated by the application of identical reference numerals with the suffix *a* added to corresponding elements. In this embodiment a second printed circuit panel 62 is disposed adjacent the panel **16*a*. A plurality of circuit elements 64 and 66 are applied to the panel 62 and are provided with terminals 68 and 70 axially aligned with the switch structure 14*a*. A second annular circuit element 72 is applied to the face of the insulating member 56*a* opposite from the circuit element 60*a* for cooperation with the terminals 68 and 70. An opening 74 is provided in the panel 62 through which a tool may be inserted for turning and adjusting the screw member 32*a*. It will be appreciated that with this structure, the switch may be adjusted selectively to open and close the sets of terminals 24*a*—28*a* and 68—70**.

In Fig. 8 there is shown another embodiment of the present invention which is similar to the above described structure as indicated by the application of identical reference numerals with the suffix *b* added to corresponding elements. In this embodiment the switch structure is applied to the circuit panel so that the contact assembly **34*b* is located at a side of the panel opposite from the circuit elements on the panel. The terminals 24*b* and 28*b* in this embodiment are provided by metallic eyelets which are electrically connected with the circuit elements 20*b* and 26*b* at one side of the panel and extending through the panel for cooperation with the circuit element 60*b*** of the switch structure.

While the preferred embodiments of the present invention have been shown and described herein it is obvious that many structural details may be changed without departing from the spirit and scope of the appended claims.

The invention is claimed as follows:

1. An electrical switch comprising a screw member adapted to be adjustably mounted, a member of insulating material carried by said screw member and retained against substantial movement axially of said screw member, and printed circuit electricity conducting means mounted on said insulating member and projecting axially of the surface thereof and spaced radially outwardly from the screw member and insulated from said screw member by said insulating member for closing and opening a circuit upon adjustment of said screw member.

2. A preassembled electrical switch structure comprising a screw member having a threaded shank, an annular insulating member mounted on said shank and retained against substantial axial movement along said shank, and a pair of substantially annular circuit elements respectively disposed on opposite faces of said annular member and insulated from said screw member for closing and opening a circuit upon adjustment of said screw member.

3. In a chassis for electrical equipment such as television and the like, a panel of insulating material, a plurality of printed circuit elements on said panel having adjacently disposed spaced terminals, said panel having an aperture therethrough adjacent said terminals and defined by integral helical thread means, a screw member engageable with said thread means and adjustably mounted in said aperture, an insulating member mounted on said screw member and retained against substantial axial movement relative to the screw member and overlying said terminals, and a printed circuit element on said insulating member and insulated from said screw member for connecting and disconnecting said terminals upon axial adjustment of said screw member.

4. In a chassis for electrical equipment such as television and the like, a pair of panels of insulating material disposed in adjacently spaced relationship, a plurality of printed circuit elements on each of said panels, the circuit elements on each panel respectively having adjacently disposed spaced terminals, at least one of said panels having an aperture therethrough adjacent the terminals thereon and defined by integral helical thread means, a screw member engageable with said thread means and adjustably mounted in said aperture, and projecting between said panels, an insulating member disposed between said panels and mounted on said screw member and retained against substantial axial movement relative to the screw member and disposed in general alignment with the terminals on each of said panels, and printed circuit elements respectively on said insulating member and insulated from each other and from said screw member for selectively connecting and disconnecting the terminals on each of said panels on adjustment of the screw member.

5. A structure, as defined in claim 4, wherein said screw member includes a slotted head portion disposed between said panels, and the other of said panels has an opening in alignment with said head for accommodating a screwdriver or the like applied to the head for turning the screw member.

6. In a chassis for electrical equipment such as television and the like, a panel of insulating material of predetermined thickness, a plurality of printed circuit elements upon said panel and having adjacently disposed spaced terminals, said panel having an aperture therethrough adjacent said terminals and defined by integral helical thread convolutions, a screw member having a shank engageable with said thread convolutions and adjustably mounted in said aperture, said shank having an intermediate reduced diameter portion longer than the thickness of said panel for indicating a position to which the screw member is adjusted with respect to the panel, said screw member including portions at opposite ends of said intermediate portion having helical thread convolutions thereon complementary to said helical thread convolutions on said panel defining said aperture, an insulating member mounted on said screw member and spaced from said intermediate shank portion, means for retaining said insulating member against substantial axial movement along said shank, and a printed circuit element on said insulated member and insulated from said screw member and overlying said terminals for disconnecting and connecting said terminals upon axial adjustment of said screw member.

7. In a chassis for electrical equipment such as a television and the like, a panel of insulating material, a plurality of printed circuit elements on one side of said panel, a plurality of terminal elements respectively connected with said circuit elements and extending to an opposite side of said panel, said panel having an aperture therethrough adjacent said terminal elements defined by integral helical thread means, a screw member engageable with said thread means and adjustably mounted in said aperture, an insulating member mounted on said screw member at said opposite side of the panel and retained against substantial axial movement relative to the screw member, and a printed circuit element on said insulating member and insulated from said screw member and overlying said terminal elements for connecting and disconnecting said terminal elements upon axial adjustment of said screw member.

References Cited in the file of this patent

UNITED STATES PATENTS

| | | |
|---|---|---|
| 2,064,736 | Dahl | Dec. 15, 1936 |
| 2,616,994 | Luhn | Nov. 4, 1952 |